(12) United States Patent
Moon et al.

(10) Patent No.: US 10,978,663 B2
(45) Date of Patent: Apr. 13, 2021

(54) ELECTROLUMINANCE LIGHTING DEVICE

(71) Applicant: LG Display Co., Ltd., Seoul (KR)

(72) Inventors: Youngkyun Moon, Paju-si (KR); JongMin Kim, Paju-si (KR); Seunghyun Youk, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 80 days.

(21) Appl. No.: 16/550,114

(22) Filed: Aug. 23, 2019

(65) Prior Publication Data

US 2020/0203654 A1 Jun. 25, 2020

(30) Foreign Application Priority Data

Dec. 24, 2018 (KR) .................. 10-2018-0168075

(51) Int. Cl.
*H01L 51/52* (2006.01)
*H01L 27/32* (2006.01)

(52) U.S. Cl.
CPC ...... *H01L 51/5203* (2013.01); *H01L 27/3237* (2013.01); *H01L 27/3288* (2013.01); *H01L 51/5253* (2013.01)

(58) Field of Classification Search
CPC ............. H01L 51/5203; H01L 51/5253; H01L 27/3237; H01L 27/3288
See application file for complete search history.

(56) References Cited

U.S. PATENT DOCUMENTS

2019/0267433 A1* 8/2019 An ...................... H01L 27/3248
2019/0363284 A1* 11/2019 Yasuda ............... H01L 51/0097

FOREIGN PATENT DOCUMENTS

KR 10-2006-0128274 A 12/2006
KR 10-2013-0020068 A 2/2013

* cited by examiner

*Primary Examiner* — Marc Anthony Armand
(74) *Attorney, Agent, or Firm* — Polsinelli PC

(57) ABSTRACT

The present disclosure relates to an electroluminescence lighting device. The present disclosure provides an electroluminescence light device comprising: a substrate including an emission area divided into a plurality of segments and non-emission area surrounding the emission area; a segment line arranged from the non-emission area to the segment; a buffer layer on the segment line; an auxiliary line defining a plurality of pixels within each segment on the buffer layer; a first pad disposed at the non-emission area; a segment switch disposed at the non-emission area and connecting the first pad to the segment line; and an emission element disposed at each pixel.

19 Claims, 7 Drawing Sheets

ELECTROLUMINANCE LIGHTING DEVICE

CROSS REFERENCE TO RELATED APPLICATION

This application claims the benefit of the Korean Patent Application No. 10-2018-0168075 filed on Dec. 24, 2018, which is hereby incorporated by reference in its entirety.

BACKGROUND

Field of the Disclosure

The present disclosure relates to an electroluminescence lighting device. Especially, the present disclosure relates to an electroluminescence lighting device including an organic light emitting element and capable of realizing various lighting systems by dividing the light emitting surface into multiple segments.

Description of the Background

Recently, a series of researches has been actively conducted to use an organic light emitting element as a light source of the lighting device or a display device, based on many advantages and/or merits of an organic light emitting device. For example, a surface light source and/or a point light source applied with the organic light emitting element are applied to the lighting system for the vehicles such as an interior mood lamp, a head lamp, a fog lamp, a retracted lamp, a car light, a number light, a tail lamp, a brake light, a turn signal lamp and so on.

When an organic light emitting element is applied to the lighting device, it is necessary to have a robust structure against the foreign materials such as moisture and oxygen which can penetrate from the outside according to its applied environment. In addition, due to the loss of light amount occurred in the organic light emitting element itself, the luminescent efficiency may be degraded. Therefore, in order to apply the organic light emitting element to the lighting device, it is necessary to develop a structure that protects the element from the external environment and improve the luminescence efficiency and the aperture ratio.

Furthermore, there are various kinds of the lighting apparatus (or device) depending on the purpose of usage and the application field, from the small sized products such as a portable flash-light to the large scale products such as a backlight panel for an outdoor signboard. Also, there is an increasing demand for a multi-purpose lighting device capable of expressing various patterns, characters, symbols or icons.

SUMMARY

As for solving the problems described above, the present disclosure provides an electroluminescence lighting device having a plurality of light emitting segments (or sections) by dividing a light emitting surface in which the light emitting segments are partially or totally activated for radiating lights.

In addition, the present disclosure provides an electroluminescence lighting device in which the number of segments comprising the light emitting surface is not limited or restricted by the designing condition. Further, the present disclosure provides a high-quality electroluminescent lighting device in which a space occupied by the signal wirings for supplying the electric currents for each segment is removed or minimized, so that a boundary of each segment is not visually detected and the aesthetics of the lighting device may be enhanced.

As described above, the present disclosure provides an electroluminescence light device comprising: a substrate including an emission area divided into a plurality of segments and non-emission area surrounding the emission area; a segment line arranged from the non-emission area to the segment; a buffer layer on the segment line; an auxiliary line defining a plurality of pixels within each segment on the buffer layer; a first pad disposed at the non-emission area; a segment switch disposed at the non-emission area and connecting the first pad to the segment line; and an emission element disposed at each pixel.

In one aspect, the segment line is overlapped with the auxiliary line, and connected to the auxiliary line through the contact hole formed at the buffer layer.

In one aspect, the electroluminescence lighting device further comprises: an anode layer on the auxiliary line; an emission layer on the anode layer; a cathode layer on the emission layer; an encapsulation layer on the cathode layer; and a cover film attached on the encapsulation layer by an adhesive.

In one aspect, the anode layer includes: a power line contacting and covering the auxiliary line; a first electrode coupling to the power line and formed in the pixel; and a link electrode coupling to the first electrode to the power line.

In one aspect, the electroluminescence lighting device further comprises: a passivation layer covering the power line, the link electrode and circumferences of the first electrode, and exposing middle portions of the first electrode for defining an open area.

In one aspect, the emission element is formed with the first electrode, the emission layer and the cathode layer overlapped at the open area.

In one aspect, the electroluminescence lighting device further comprises: a second electrode extended from the cathode layer to the non-emission area.

In one aspect, the segments have same shape and size, and are arrayed in a matrix manner in a plan, the segment lines are arrayed in such a manner as the segment lines corresponding to the number of the segments arrayed in a column are overlapped with the segments, and the auxiliary line allocated each segment is connected to each segment line in a one-to-one correspondence through one contact hole allocated each segment.

In one aspect, the first pad supplies an electric voltage for driving the segment to the segment line.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1A:
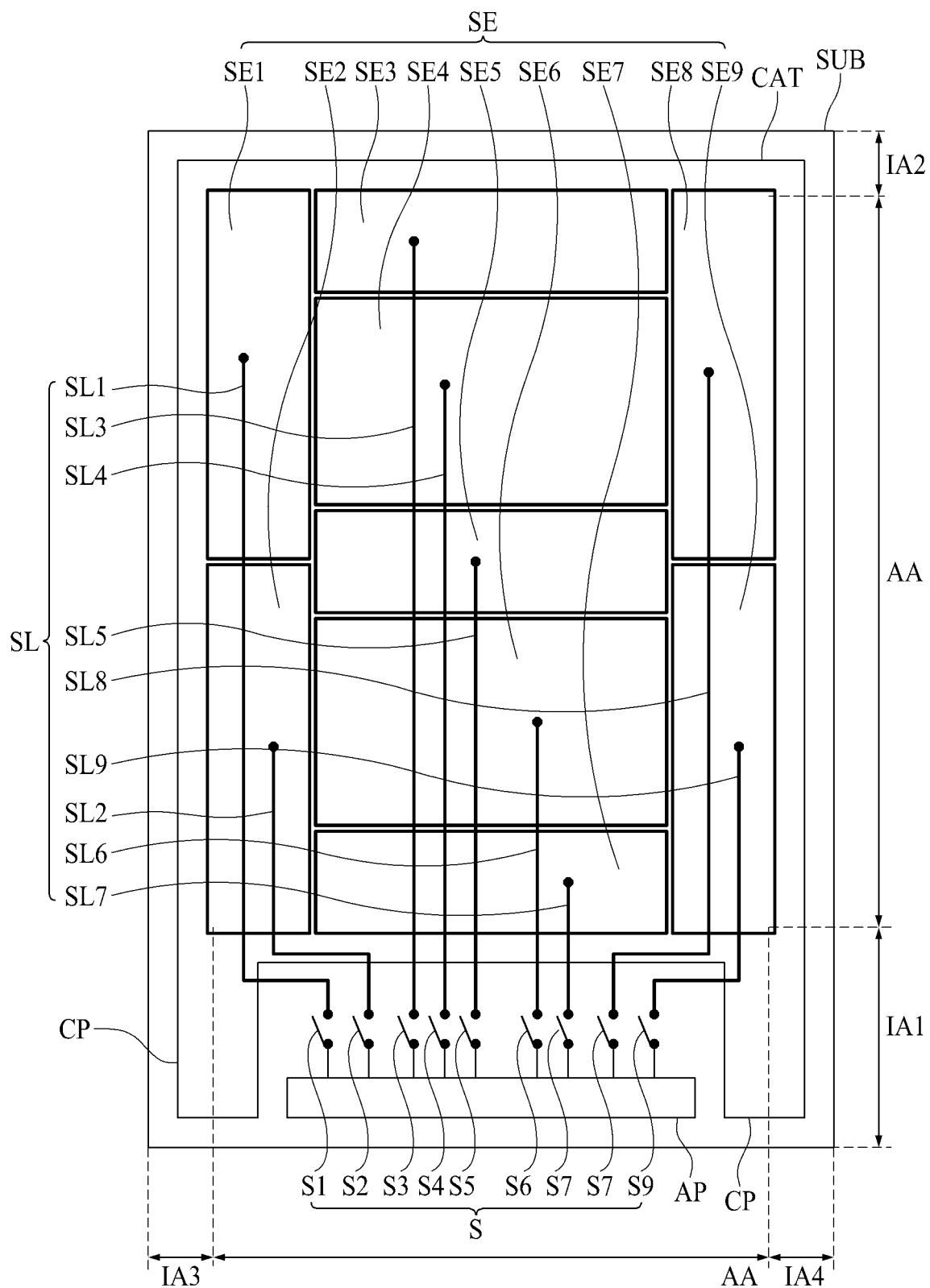
FIG. 1A is a plan view illustrating a structure of a segment included in an electroluminescence lighting device according to a first aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal (or X) axis direction," "second horizontal (or Y) axis direction," and "vertical (or Z) axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, referring to FIGS. 1A, 1B and 2, an electroluminescence lighting device according to a first aspect of the present disclosure will be explained. At first, referring to FIG. 1A, the structure of the electroluminescence lighting device according to the first aspect will briefly explained. FIG. 1A is a plan view illustrating a structure of a segment included in an electroluminescence lighting device according to the first aspect of the present disclosure. In this aspect, the lighting device is an organic luminance lighting device, but it is not limited thereto.

Referring to FIG. 1A, the electroluminescence lighting device according to the first aspect of the present disclosure comprises a substrate SUB, a segment SE, a segment line SL, a segment switch S, a first pad AP and a second pad CP.

The substrate SUB, as a based substrate (or a base layer), includes a plastic material or a glass material. The lighting device may have various shapes and the properties suitable for the functional purposes. Therefore, the substrate SUB may have characteristics suitable for its function and purpose. For example, the substrate SUB may be formed of an opaque material to provide the lights in only one direction of the substrate SUB, or may be formed of a transparent material to provide the lights in both directions of the substrate SUB. In one example, the substrate SUB, in a plan view, may have a rectangular shape, a rounded rectangular shape in which each corner is rounded with a certain radius of curvature, a non-square shape having at least 5 sides, a circular shape or an elliptical shape. As determining the shape and size of the lighting device, the substrate SUB may have various shapes such as an elongated rectangle, a regular rectangle, a rhombus, and a polygon. Here, for convenience of explanation, an elongated rectangular shape will be used for example of the substrate SUB.

The substrate SUB may include an emission area AA and a non-emission area IA. The emission area AA is disposed in the most middle portions of the substrate SUB which can be defined as an area for emitting the lights. In one example, the emission area AA may have, in a plan view, a rectangular shape, a rounded rectangular shape and non-rectangular shape having at least 5 sides. The emission area AA may have the same shape as the substrate SUB, but is not necessarily. The emission area AA may have the different shape from that of the substrate SUB for the manufacturing purposes and/or the functional requirements.

The non-emission area IA is provided in the circumferential area of the substrate SUB to surround the emission area AA, which may be defined as an area in which light is not provided therefrom. In one example, the non-emission area IA may include a first non-emission area IA1 disposed at the first side of the substrate SUB, a second non-emission area IA2 disposed at the second side parallel to the first non-emission area IA1, a third non-emission area IA3 disposed at the third side perpendicular to the first non-emission area IA1, and a fourth non-emission area IA4 disposed at the fourth side parallel to the third non-emission area IA3. In detail, the first non-emission area IA1 may be set on the upper side (or lower side) of the substrate SUB, the second non-emission area IA2 may be set on the lower side (or upper side) of the substrate SUB, the third non-emission area IA3 may be set on the left side (or right side) of the substrate SUB, and the fourth non-emission area IA4 may be set on the right side (or left side) of the substrate SUB. But it is not restricted thereto.

Within the emission area AA on the substrate SUB, a plurality of segments SE may be disposed. For example, as shown in FIG. 1A, nine segments SE1 to SE9 may be arranged. The segments SE may be arrayed in a matrix manner or without a specific manner. The arrangement in FIG. 1A shows that the seven segments SE1, SE2, SE3, SE5, SE7, SE8 and SE9 are arranged as representing numeric numbers and two segments SE4 and SE6 are arranged as allocating the empty space surrounded by the 7 segments.

The segment SE may include a first electrode of the electroluminescence element. Therefore, the segment SE may be formed of the anode material. For example, depositing a transparent conductive material on the substrate SUB as a film layer and patterning the film layer, the nine segments SE1 to SE9 as shown in FIG. 1A may be formed.

A plurality of segment lines SL may be formed on the substrate SUB. Each segment line SL may be allocated to each segment SE, respectively. For example, the first segment line SL1 is allocated to the first segment SE1, the second segment line SL2 is allocated to the second segment SE2, the third segment line SL3 is allocated to the third segment SE3, and the fourth segment line SL4 is allocated to the fourth segment SE4. Likewise, the fifth segment line SL5 is allocated to the fifth segment SE5, the sixth segment line SL6 is allocated to the sixth segment SE6, the seventh segment line SL7 is allocated to the seventh segment SE7, the eighth segment line SL8 is allocated to the eighth segment SE8, and the ninth segment line SL9 is allocated to the ninth segment SE9.

FIG. 1A shows that the segments SE are disposed with a predetermined gap between them. However, these gaps are shown in figures only for visual distinguishing between neighboring segments, actually these gaps may be removed or very narrowed so that these gaps cannot be recognized visually. Therefore, the electroluminescence lighting device can display various patterns or symbols freely as lighting these segments with various combinations. Further, as the gaps between segments SE cannot be visually recognized, the lighting device may provide superior lighting quality.

The electroluminescence lighting device according to the first aspect of the present disclosure may further comprise a first pad AP, a second pad CP and a segment switch S in the non-emission area IA. FIG. 1A shows that these elements are disposed at the first non-emission area IA1 of the non-emission area IA, but it is not restricted thereto, they are may be disposed in other non-emission area with the various manners on the substrate SUB according to the purposes or configurations.

The first pad AP may be disposed at the middle portion of the first non-emission area IA1. The first pad AP may be disposed as an island shape in which the first pad AP is not physically connected to the segments SE, the auxiliary lines AL and the segment lines SL which are disposed at the emission area AA.

The first pad AP may be the electrical pad terminal for receiving the driving power from the outside, and for supplying the driving power selectively to the segments SE. To do so, the segment switch S may be disposed between the first pad AP and the segment SE.

For example, the first segment switch S1 is disposed between the first pad AP and the first segment line SL1. The second segment switch S2 is disposed between the first pad AP and the second segment line SL2. The third segment switch S3 is disposed between the first pad AP and the third segment line SL3. The fourth segment switch S4 is disposed between the first pad AP and the fourth segment line SL4. The fifth segment switch S5 is disposed between the first pad AP and the fifth segment line SL5. The sixth segment switch S6 is disposed between the first pad AP and the sixth segment line SL6. The seventh segment switch S7 is disposed between the first pad AP and the seventh segment line SL7. The eighth segment switch S8 is disposed between the first pad AP and the eighth segment line SL8. The ninth segment switch S9 is disposed between the first pad AP and the ninth segment line SL9.

The second pad CP may be disposed in the non-emission area IA as disconnected from the first pad AP physically and electrically. For example, the second pad CP may be disposed at both sides of the first pad AP, respectively. The second pad CP is the electrical pad terminal for receiving the common voltage for driving the segments SE. The second pad CP may be formed as connected to the cathode layer CAT or may be formed as one body with the cathode layer CAT.

Next, further referring to FIGS. 1B and 2, the structure of the electroluminescence lighting device according to one example of the present disclosure will be explained in detail. FIG. 1B is a plan view illustrating a wiring structure or layout in an electroluminescence lighting device according to the first aspect of the present disclosure. FIG. 2 is a cross-sectional view, taken along line I-I' of FIG. 1B, illustrating a structure of an electroluminescence lighting device according to the first aspect of the present disclosure.

Figure 1B:
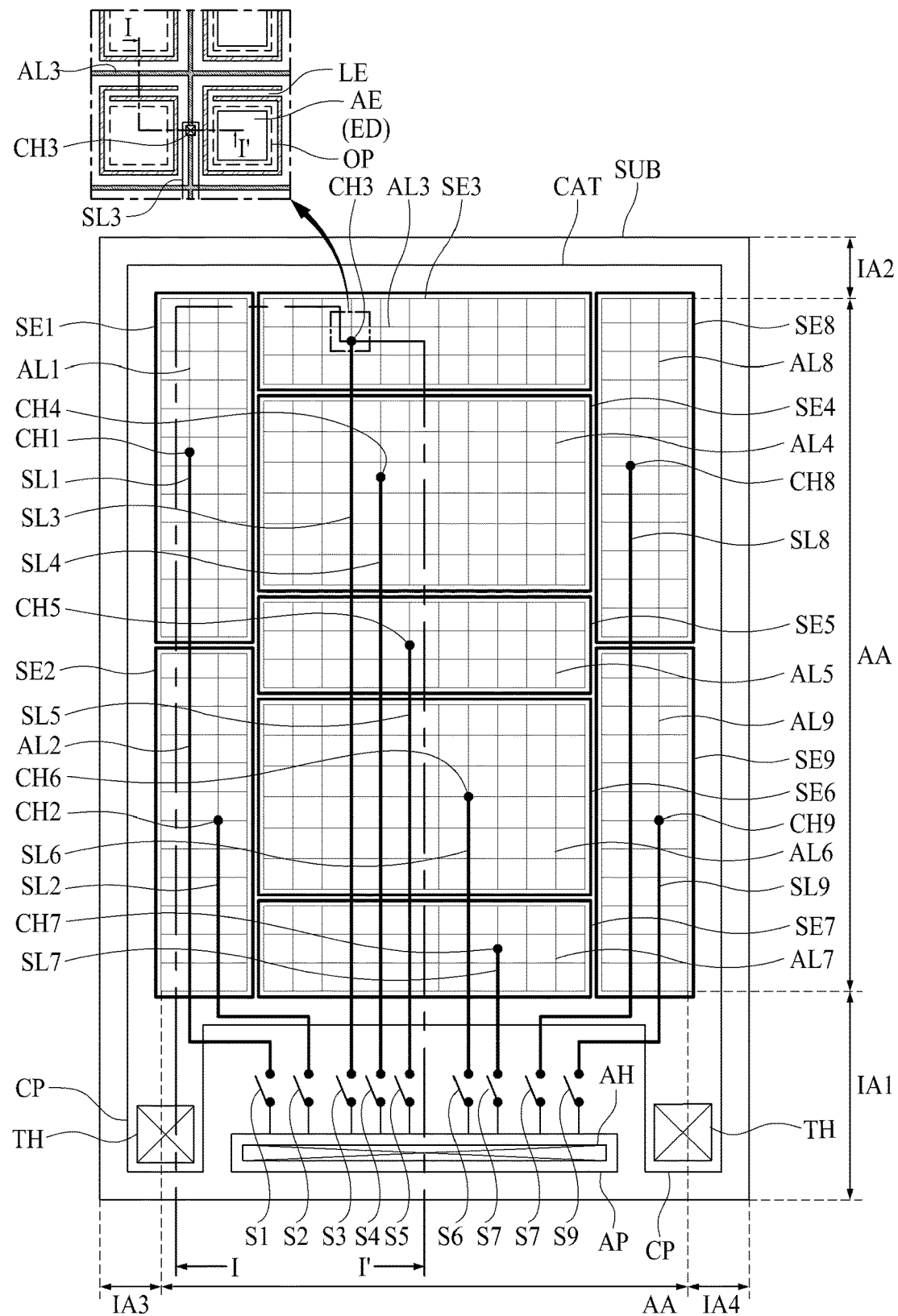
FIG. 1B is a plan view illustrating a wiring structure or layout in an electroluminescence lighting device according to the first aspect of the present disclosure.
Figure 2:
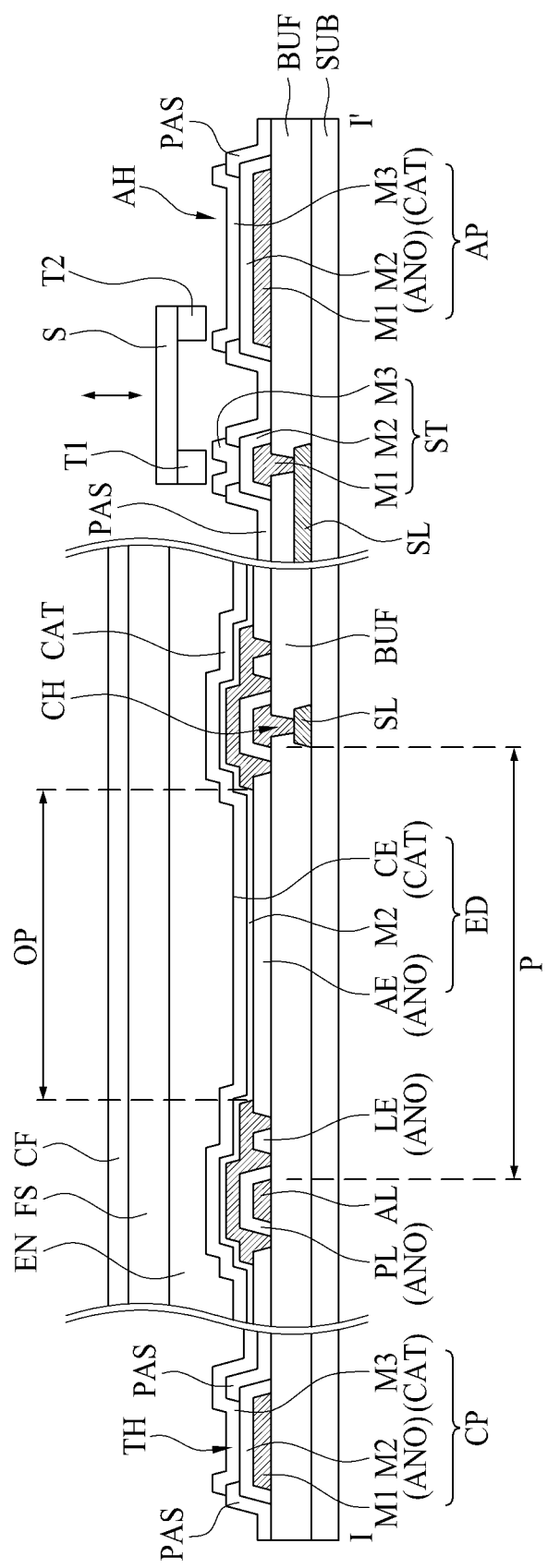
FIG. 2 is a cross-sectional view, taken along line I-I' of FIG. 1B, illustrating a structure of an electroluminescence lighting device according to the first aspect of the present disclosure.

Referring to FIGS. 1A, 1B and 2, the electroluminescence lighting device according to the present disclosure comprises a substrate SUB, a segment SE, a segment line SL, an auxiliary line AL, an anode layer ANO, an emission element ED, a cathode layer CAT, a first pad AP, a second pad CP, a segment switch, an encapsulation layer EN and a cover film CF.

The substrate SUB, as a based substrate (or a base layer), includes a plastic material or a glass material. For example, the substrate SUB may include an opaque or a colored polyimide material. The substrate SUB may include a flexible substrate or a rigid substrate. For example, the flexible substrate SUB may be made of glass material may be a thinned glass substrate having a thickness of 100 micrometer or less, or may be etched glass substrate to have a thickness of 100 micrometer or less.

On the substrate SUB, a plurality of segment lines SL may be firstly formed. On the segment lines SL, a buffer layer BUF may be deposited as covering whole surface of the substrate SUB. The buffer layer BUF is the element for preventing the foreign materials such as moisture or oxygen from intruding into the emission element ED. For example, the buffer layer BUF may include a plurality of inorganic layers in which different inorganic materials are alternately stacked each other. In one example, the buffer layer BUF may include a multiple layers in which two or more inorganic layers of any one of the silicon oxide (SiOx), the silicon nitride (SiNx) and the silicon oxy-nitride layer (SiON) are alternately stacked each other. The buffer layer BUF may have at least two of organic layer and inorganic layer stacked alternately each other.

The auxiliary line AL may be formed on the buffer layer BUF. The auxiliary line SL is disposed as being allocated to each segment SE, separately. For example, the first auxiliary line AL1 is disposed within the first segment SE1, the second auxiliary line AL2 is disposed within the second segment SE2, the third auxiliary line AL3 is disposed within the third segment SE3, and the fourth auxiliary line AL4 is disposed within the fourth segment SE4. Likewise, the fifth auxiliary line AL5 is disposed within the fifth segment SE5, the sixth auxiliary line AL6 is disposed within the sixth segment SE6, the seventh auxiliary line AL7 is disposed within the seventh segment SE7, the eighth auxiliary line AL8 is disposed within the eighth segment SEB, and the ninth auxiliary line AL9 is disposed within the ninth segment SE9. The auxiliary lines AL1 to AL9 are physically and/or electrically separated each other.

The auxiliary line AL may have a grid/mesh or strip pattern within each of the segment SE. As FIG. 1B shows that the auxiliary line AL is patterned as the grid opening shape having a predetermined square area, but it is not restricted thereto. By the grid/mesh structure of the auxiliary line AL, the unit pixel area P may be defined as corresponding to the grid shape. The auxiliary line AL may be uniformly distributed within the segment SE in order to maintain a uniform electric power voltage.

The auxiliary line AL disposed within each of the segment SE may be supplied with the electric power from the segment line SL. For example, the segment line SL may be an electric wiring line for supplying a positive (+) voltage to the auxiliary line AL. To do so, each of the auxiliary lines AL1 to AL9 may be connected to each of the segment line SL1 to SL9, respectively, allocated to each of the segment SE1 to SE9, in a one-to-one correspondence.

To establish these connections, the buffer layer BUF may have a plurality of contact holes CH1 to CH9 exposing some of each of the segment line SL1 to SL9 allocated to each of the segment SE1 to SE9. The first auxiliary line AL1 connects to the first segment line SL1 via the first contact hole CH1. The second auxiliary line AL2 connects to the second segment line SL2 via the second contact hole CH2. The third auxiliary line AL3 connects to the third segment line SL3 via the third contact hole CH3. The fourth auxiliary line AL4 connects to the fourth segment line SL4 via the fourth contact hole CH4. The fifth auxiliary line AL5 connects to the fifth segment line SL5 via the fifth contact hole CH5. The sixth auxiliary line AL6 connects to the sixth segment line SL6 via the sixth contact hole CH6. The seventh auxiliary line AL7 connects to the seventh segment line SL7 via the seventh contact hole CH7. The eighth auxiliary line AL8 connects to the eighth segment line SL8 via the eighth contact hole CH8. The ninth auxiliary line AL9 connects to the ninth segment line SL9 via the ninth contact hole CH9.

The segment line SL and the auxiliary line AL are formed on different layers each other with the buffer layer BUF there-between. The segment line SL and the auxiliary line AL are vertically overlapped each other. The segment line SL and the auxiliary line AL may be formed of same metal material. For example, by depositing and patterning a metal material having superior electrical conductivity such as copper (Cu) and aluminum (Al), the segment line SL may be formed on the substrate SUB. After coating the buffer layer BUF, the auxiliary line AL may be formed by depositing and patterning the same metal material on the buffer layer BUF.

The anode layer ANO may have a pattern divided per each segment SE within the emission area AA. That is, the segment SE is formed by patterning the anode layer so that the anode layer ANO includes the segments SE. By depositing and patterning the anode material, the segment SE may be formed as having a specific shape.

For example, the first segment SE1 is formed by patterning the anode layer to cover the first auxiliary line ALL The second segment SE2 is formed by patterning the anode layer to cover the second auxiliary line AL2. The third segment SE3 is formed by patterning the anode layer to cover the third auxiliary line AL3. The fourth segment SE4 is formed by patterning the anode layer to cover the fourth auxiliary line AL4. The fifth segment SE5 is formed by patterning the anode layer to cover the fifth auxiliary line AL5. The sixth segment SE6 is formed by patterning the anode layer to cover the sixth auxiliary line AL6. The seventh segment SE7 is formed by patterning the anode layer to cover the seventh auxiliary line AL7. The eighth segment SE8 is formed by patterning the anode layer to cover the eighth auxiliary line ALB. The ninth segment SE9 is formed by patterning the anode layer to cover the ninth auxiliary line AL9.

The anode layer ANO may be stacked over the auxiliary line AL as being directly contact the auxiliary line AL. The lighting device shown in FIG. 2 is the bottom emission type. In this case, the anode layer ANO may have a transparent conductive material or a semi-transparent conductive material for passing through the lights.

Each segment SE may have a structure in which a plurality of unit pixels P divided by the auxiliary line AL is arrayed in certain manner. All pixels P included in any one segment SE are connected, but not connected to other pixels P allocated within other segment SE. Within any one unit pixel P divided by the auxiliary line AL, a power line PL, a link electrode LE and a first electrode AE are formed by patterning the anode layer ANO. The power line PL has a structure as separately covering the auxiliary line AL individually formed per segment SE. The first electrode AE has a pattern having polygon shape formed at each unit pixel P. The link line LE is a linking portion having a rod or segment shape connecting the first electrode AE to the power line PL. The link electrode LE, as a pathway for supplying the power voltage from the power line PL to the first electrode AE, may play a role of resistance as being patterned as a thin line. For example, when the first electrode AE allocated at any one unit pixel P has the short-circuit problem, the link electrode LE, playing a role of the high-resistor, may be broken so that the short-circuit problem may not affect to other unit pixels P.

On the anode layer ANO, a passivation layer PAS is deposited and patterned. In detail, the passivation layer PAS covers the power line PL and the link electrode LE, but exposes most middle area of the first electrode AE. The dotted line within the first electrode AE in FIG. 1B means the opening area (or aperture) OP formed at the passivation layer PAS. In other words, the passivation layer PAS may define the shape and size of the emission element ED by covering the circumferences of the first electrode AE and exposing the center area of the first electrode AE. The size and the shape of the opened area of the first electrode AE formed in the unit pixel P area may be defined as the open area OP (or emitting area) of the pixel. In this application, "emission area" AA means the area providing the lights over the whole lighting device, the "open area" (or "emitting area") OP means the area providing the lights within one unit pixel P.

The emission layer EL is disposed on the substrate SUB having the passivation layer PAS defining the emitting area OP within unit pixel P. The emission layer EL may be formed as one thin layer covering the emission area AA overall. For example, the emission layer EL may include a first emission portion and a second emission portion for radiating a white light by mixing a first color light and a second color light. Here, the first emission portion may include any one of a blue emission portion, a green emission portion, a red emission portion, a yellow emission portion, and a yellow-green emission portion to emit the first color light. In the interim, the second emission portion may include any one among a blue emission portion, a green emission portion, a red emission portion, a yellow emission portion, and a yellow-green emission portion, to emit the second color light having a complementary relation to the first color light.

The cathode layer CAT may be deposited on the emission area AA including all segments SE overall of the substrate SUB. The cathode layer CAT may be made of a metal material having superior reflectiveness property. For example, the cathode layer CAT may include a multiple layered structure such as a stacked structure of aluminum and titanium (i.e., Ti/Al/Ti), a stacked structure of aluminum and ITO (indium tin oxide) (i.e., ITO/Al/ITO), an APC alloy (Ag/Pd/Cu), and a stacked structure of APC alloy and ITO (i.e., ITO/APC/ITO). Otherwise, the cathode layer CAT may include a single layered structure having any one material or alloy material of two or more among silver (Ag), aluminum (Al), molybdenum (Mo), gold (au), magnesium (Mg), calcium (Ca) or barium (Ba).

The cathode layer CAT may be directly contact with the emission layer EL thereon. Therefore, in the open area (or emitting area) OP of pixel P, the first electrode AE, the emission layer EL and the cathode layer CAT are sequentially stacked as being contacted in surface. Within the cathode layer CAT, the portion corresponding to the open area OP may be defined as the second electrode CE.

The emission element ED is formed at the open area OP defined by the passivation layer PAS. The emission element ED includes the first electrode AE, the emission layer EL and the second electrode CE. The emission layer EL is stacked on the first electrode AE and contacted thereto in surface. The second electrode CE is stacked on the emission layer EL and contacted thereto in surface. The second electrode CE is some portions of the cathode layer CAT corresponding to the open area OP, in which the cathode layer CAT is stacked on the emission layer EL as covering all area of the emission area AA on the substrate SUB.

Until now, we explained bout the emission area AA having the segments SE, mainly. The electroluminescence lighting device according to the present disclosure has the characteristics in which each of the segments SE can be operated separately. Therefore, it is required that the driving power source should have a structure for individually supplying the power to each of the segment SE. Hereinafter, the structure for the power supplying will be explained mainly.

The electroluminescence lighting device according to the present disclosure may further comprise a first pad AP, a second pad CP and a segment switch S in the non-emission area IA. In FIGS. 1A and 1B, they are disposed in the first non-emission area IA1, but it is not restricted thereto. They are may be disposed in other non-emission area with the various manners on the substrate SUB according to the purposes or configurations.

The first pad AP may be disposed at the middle portion of the first non-emission area IA1. The first pad AP may be disposed as an island shape in which the first pad AP is not physically connected to the segments SE, the auxiliary lines AL and the segment lines SL which are disposed at the emission area AA.

The first pad AP may be formed as having various structures using a metal layer or a conductive layer disposed in the emission area AA. The first pad AP may have a structure in which three conductive layers are stacked. For example, the first layer M1 may be formed of the same material as the auxiliary line AL, and then the second layer M2 may be formed of the anode layer ANO as covering the first layer M1. The first layer M1 and the second layer M2 may be directly contacted in surface. A passivation layer PAS may be stacked on the first layer M1 and the second layer M2. By forming a first pad contact hole AH penetrating the passivation layer PAS, the upper surface of the second layer M2 may be exposed. After that, using the cathode layer CAT, the third layer M3 may be formed as contacting the second layer M2 through the first pad contact hole AH. Here, the first pad AP may have an island shape by physically separated from other elements.

The segment switches S are configured as the mechanical switches or as the electronic switching elements such as the thin film transistors. Here, we explain about the case of the mechanical switches. When the segment switch S is 'ON' state as pressed, the first pad AP may be electrically connected to the segment line SL. When the segment switch S is 'OFF' state as released, the first pad AP may be electrically disconnected from the segment line SL.

In one example, the segment switch S may include a first end T1 corresponding to the segment line SL and a second end T2 corresponding to the first pad AP. The first end T1 may be arranged to face with the third layer M3 of the first pad AP. Further, the second end T2 may be arranged to face with the end of the segment line SL.

For connection of the segment switch S, a connecting pad ST may be further provided at the end of the segment line SL. The connecting pad ST may have the same structure as the first pad AP. For example, the connecting pad ST may include the first layer M1 made of the same material as the auxiliary line AL and connected to the end of the segment line SL, the second layer M2 made of the same material as the anode layer ANO and deposited on the first layer M1, and the third layer M3 made of the cathode layer CAT and connected to the second layer M2.

The second pad CP may be disposed as being apart from the first pad AP with a predetermined distance in the first non-emission area IA1 For example, the second pad CP may be formed as two parts, one part is located at the left side of the first pad AP and the other part is located at the right side of the first pad AP. The second pad CP may be connected to the cathode layer CAT disposed at the emission area AA. For example, the cathode layer CAT covers the whole area of the emission area AA and expands to the both sides of the first non-emission area IA1 so that it configures a '∩'(cap) shape on the substrate SUB.

The second pad CP may be formed as having various structures using the metal layer or the conductive layer disposed in the emission area AA. For example, the second pad CP may have the same stacked structure as the first pad AP. That is, the first layer M1 may be formed of the same material as the auxiliary line AL, and the second layer M2 may be formed of the anode layer ANO as covering the first layer M1. The first layer M1 and the second layer M2 may be directly contacted in face each other. Here, the first layer M1 and the second layer M2 of the second pad CP should have island shape to be physically and electrically separated from the other elements formed of the anode layer ANO. The passivation layer PAS may be deposited on the first layer M1 and the second layer M2. Here, a second pad contact hole TH may be formed by penetrating the passivation layer PAS to expose the upper surface of the second layer M2. After that, using the cathode layer CAT, a third layer M3 may be formed as contacting the second layer M2 via the second pad contact hole TH. The third layer M3 may be connected to the cathode layer CAT physically and electrically.

The encapsulation layer EN may be deposited on the cathode layer CAT. The encapsulation layer EN is for protecting the emission elements ED disposed in the emission area AA. The encapsulation layer EN may include a single layered material, or a multiple layered material. In one example, the encapsulation layer EN may include a first inorganic layer, an organic layer on the first inorganic layer, and a second inorganic layer on the organic layer.

The inorganic layers are for preventing the foreign materials such as moisture and oxygen from intruding into the emission element ED. In one example, the inorganic layers may include at least any one of silicon nitride, aluminum nitride, zirconium nitride, titanium nitride, hafnium nitride, tantalum nitride, silicon oxide, aluminum oxide, titanium oxide and so on. The inorganic layers may be formed by the chemical vapor deposition method or the atomic layer deposition method.

In one example, the organic layer may be formed of the organic resin material such as silicon oxycarbide, acryl or epoxy. The organic layer may be formed by the coating method such as the inkjet method or the slit coating method.

The encapsulation layer EN may cover all emission area AA, and some of the non-emission area IA. However, the encapsulation layer EN may expose the first pad AP, the second pad CP and the segment switch S.

On the encapsulation layer EN, a cover film CF may be disposed or attached. The cover film CF may be a thick film including metal material. In order to attach the cover film CF to the encapsulation layer EN, an adhesive FS may be used. The cover film CF may expose the first pad AP, the second pad CP and the segment switch S.

Figure 3:
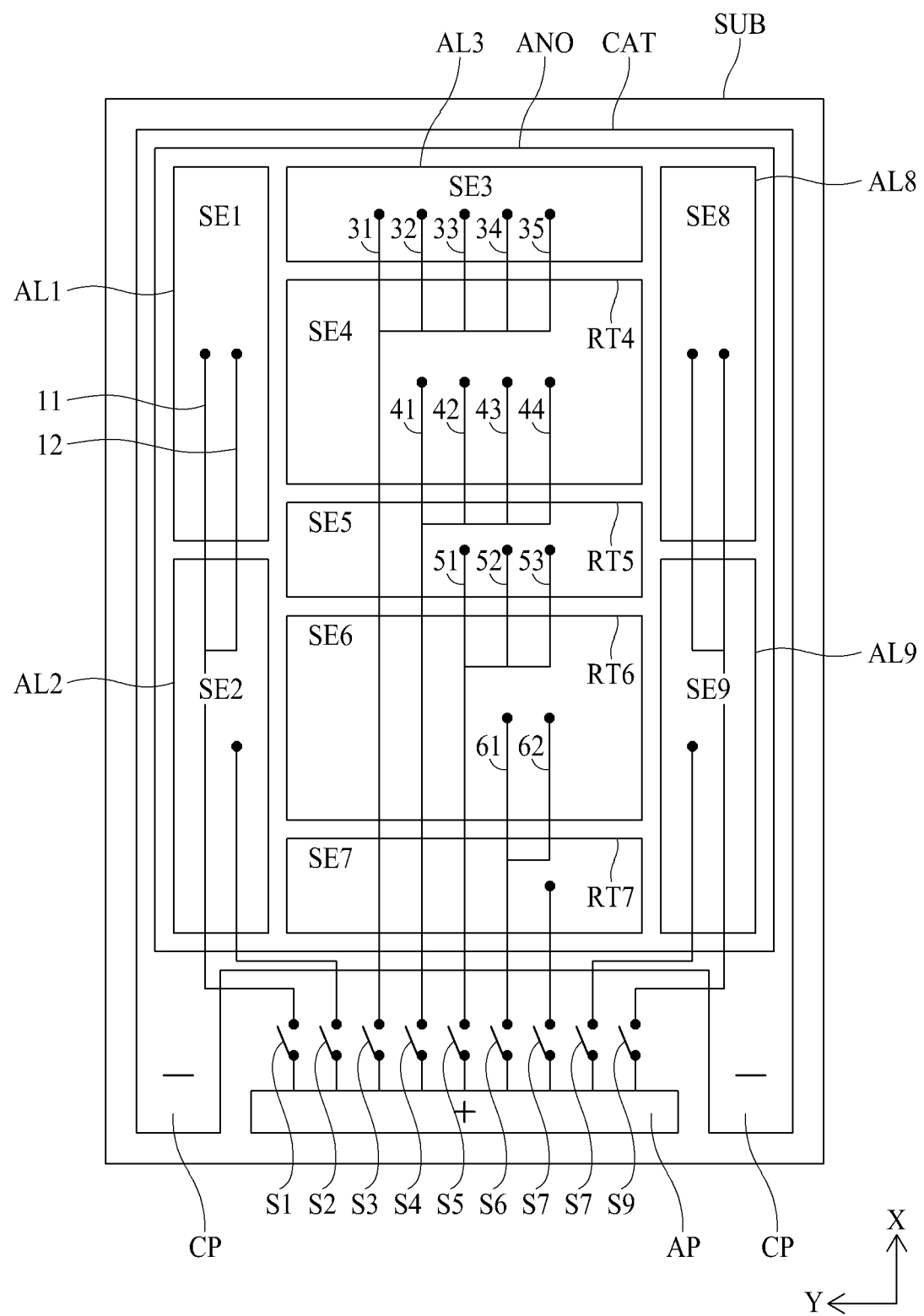
FIG. 3 is a plan view illustrating an electroluminescence lighting device according to a second aspect of the present disclosure.

Hereinafter, referring to FIG. 3, the electroluminescence lighting device according to the second aspect of the present disclosure will be explained. FIG. 3 is a plan view illustrating an electroluminescence lighting device according to a second aspect of the present disclosure.

The electroluminescence lighting device according to the second aspect of the present disclosure has a similar structure with that of the first aspect described above. One of the main differences is on the structure of the segment line SL. Hereinafter, the different features of the second aspect will be mainly described. The elements having numeric reference but not described hereinafter can be referred to the previous aspect.

Referring to FIG. 3, the electroluminescence lighting device according to the second aspect of the present disclosure comprises a substrate SUB, a segment SE, a segment line SL, an auxiliary line AL, an emission element ED, a cathode layer CAT, a first pad AP, a second pad CP and a segment switch S.

On the substrate SUB, a plurality of segment lines SL is formed. Each segment line SL is allocated at each segment SE.

The segment line SL may have a line segment shape starting from the first non-emission area IA1 having the first pad AP to the second non-emission area IA2 facing to the first non-emission area IA1 across the emission area AA. For example, when the substrate SUB is disposed on a XY plan having the X-axis along to horizontal direction and Y-axis along to vertical direction, the segment line SL may be a line segment parallel to Y-axis.

The number of the segment lines SL may be same with the number of the segments SE arrayed along to the Y-axis. For example, at the leftmost area, the first segment SE1 and the second segment SE2 are disposed along to Y-axis direction. Therefore, the first segment line SL1 and the second segment line SL2 are disposed at the leftmost area. The first segment line SL1 may include a first line part 11 arranged from the lower side of the substrate SUB to the upper side, a second line part 12 branched from the second segment SE2 and extending to the first segment SE1 as being parallel the first line part 11. That is, the first segment line SL1 may have a structure as being forked into two line segments. The second segment line SL2 has a single line segment.

In the middle area, five segments SE including the third segment SE3, the fourth segment SE4, the fifth segment SE5, the sixth segment SE6 and the seventh segment SE7 are arrayed along to Y-axis. The third segment SE3 is disposed farthest from the first pad AP receiving the electric power, and the seventh segment SE7 is disposed nearest to the first pad AP. Therefore, the line resistance of the third segment SE3 may be the highest value, and the line resistance of the seventh segment SE7 may be the lowest value.

As the results, the brightness or luminance of the segments SE may be different depending on the distance from the first pad AP. In order to prevent the brightness deviation, it may be required to lower the line resistance of the third segment line SL3 going farthest from the first pad AP. For example, the seventh segment line SL7 may have the single line segment structure. The sixth segment line SL6 may have the double line segment structure including a first line part 61 and a second line part 62. Here, the second line part 62 may be disposed on the area extended from but not connected to the seventh segment line SL7.

The fifth segment line SL5 may have a triple (3-forked) line segment structure including a first line part 51, a second line part 52 and a third line part 53. Here, the third line part 53 may be disposed on the area extended from but not connected to the second line part 62 of the sixth segment line SL6. The second line part 52 may be disposed on the area extended from but not connected to the first line part 61 of the sixth segment line SL6.

The fourth segment line SL4 may have a quadruple (4-forked) line segment structure including a first line part 41, a second line part 42, a third line part 43 and a fourth line part 44. Here, the fourth line part 44 may be disposed on the area extended from but not connected to the third line part 53 of the fifth segment line SL5. The third line part 43 may be disposed on the area extended from but not connected to the second line part 52 of the fifth segment line SL5. The second line part 42 may be disposed on the area extended from but not connected to the first line part 51 of the fifth segment line SL5.

The third segment line SL3 may have a 5-forked line structure having a first line part 31, a second line part 32, a third line part 33, a fourth line part 34 and a fifth line part 35. Here, the fifth line part 35 may be disposed on the area extended from but not connected to the fourth line part 44 of the fourth segment line SL4. The fourth line part 34 may be disposed on the area extended from but not connected to the third line part 43 of the fourth segment line SL4. The third line part 33 may be disposed on the area extended from but not connected to the second line part 42 of the fourth segment line SL4. The second line part 32 may be disposed on the area extended from but not connected to the first line part 41 of the fourth segment line SL4.

As the results, the third segment line SL3 connected to the third segment SE3 disposed farthest from the first pad AP can have the effect of reducing the line resistance, due to the five line parts forked from the third segment line SL3. Therefore, regardless of the distance from the first pad AP, or the electroluminescence lighting device of the present disclosure can provide a uniform luminance.

The segment arrayed at the rightmost side is the same as the segments arrayed at the leftmost side. In addition, the structures of the auxiliary line AL, the anode layer ANO, the emission element ED, the cathode layer CAT, the first pad AP, the second pad CP and the segment switch S are same as explained in the first aspect, so detailed explain will not be duplicated.

Figure 4:
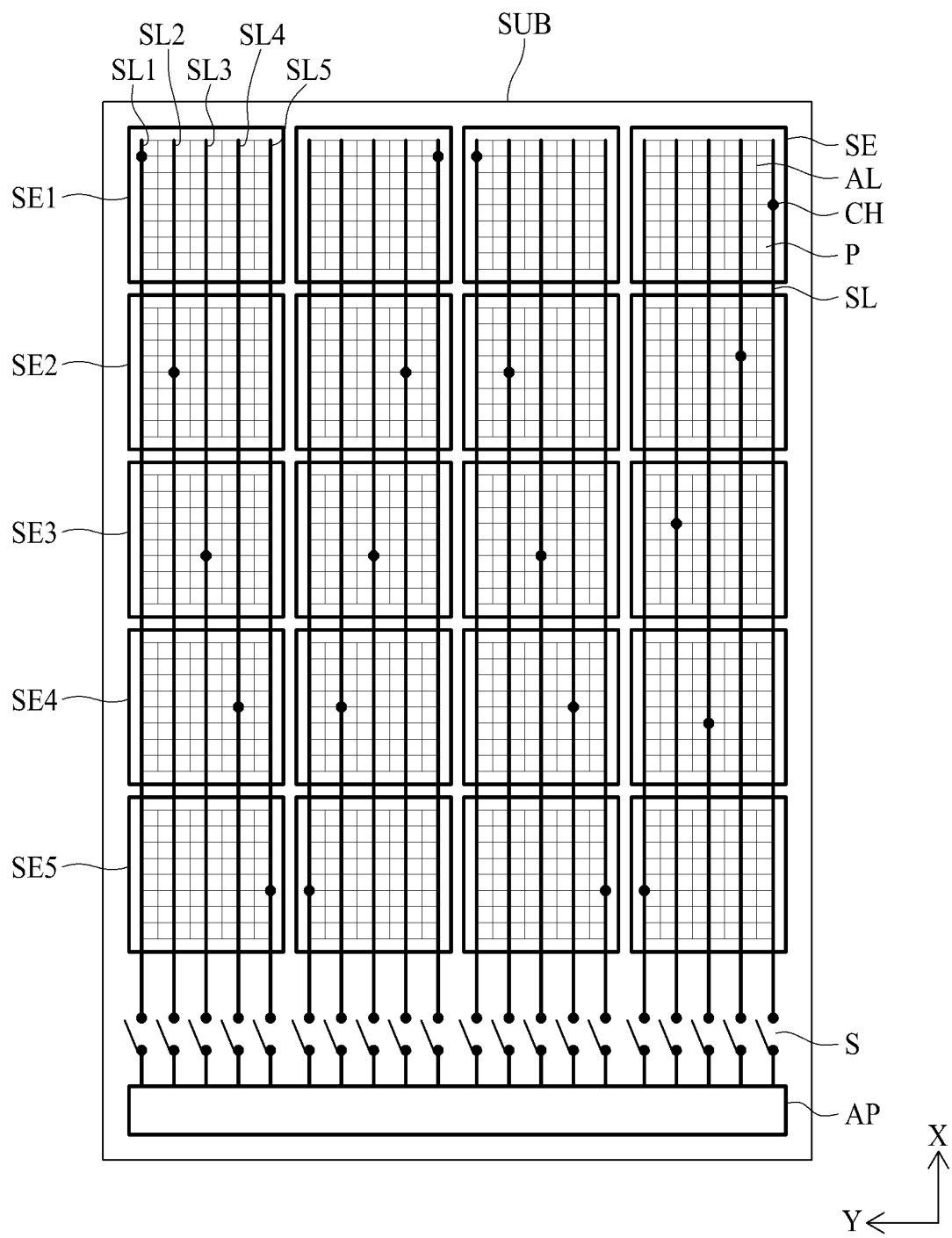
FIG. 4 is a plan view illustrating an electroluminescence lighting device according to a third aspect of the present disclosure.

Hereinafter, referring to FIG. 4, the electroluminescence lighting device according to the third aspect of the present disclosure will be explained. FIG. 4 is a plan view illustrating an electroluminescence lighting device according to a third aspect of the present disclosure.

Referring to FIG. 4, the electroluminescence lighting device according to the third aspect of the present disclosure comprises a substrate SUB, a segment SE, a segment line SL, an auxiliary line AL, a first pad AP and a segment switch S. Even though not shown in FIG. 4, an emission element ED, a cathode layer CAT and a second pad CP may be further included. In addition, for the numeric references of elements explained hereinafter but not shown in FIG. 4, the above descriptions may be referred.

The electroluminescence lighting device shown in FIG. 4 may include a plurality of segments SE arrayed in a matrix manner on the substrate SUB. For example, when the substrate SUB is disposed on a XY plan having the X-axis along to horizontal direction and Y-axis along to vertical direction, a plurality of segments SE having the same size and shape are arrayed in such manner that 4 segments are disposed along to the horizontal direction (X-axis) and 5 segments are disposed along to the vertical direction (Y-axis). However, it is not restricted thereto, more segments SE may be arrayed in the similar method.

One auxiliary line AL may be disposed at one segment SE as being mesh or grid style. Due to the mesh structure, the auxiliary line AL has the structure in which a plurality of the pixels P is arrayed in a matrix manner. For example, one segment SE may have the pixels P arrayed in an 8×8 matrix manner, totally 64 pixels P. In this case, one segment SE has 64 pixels P defined by the crossing structure of the 9 line parts of the auxiliary line AL arranged to horizontal direction (X-axis) and the 9 lines parts of the auxiliary line AL arranged to vertical direction (Y-axis). However, it is not restricted thereto, more pixels P may be further disposed.

On the substrate SUB, a plurality of segment lines SL are formed. The segment line SL may have a line segment shape starting from the first non-emission area IA1 having the first pad AP to the second non-emission area IA2 facing to the first non-emission area IA1 across the emission area AA. For example, the segment lines SL may be a line segments parallel to Y-axis.

The number of the segment lines SL may be same as the number of the segments SE arrayed along to the Y-axis. In FIG. 4, as the number of the segments SE arrayed along to Y-axis is 5, 5 segment lines SL may be arranged from the lower side to the upper side of the substrate SUB. For example, the first column of the segments SE along to the Y-axis includes a first segment SE1, a second segment SE2, a third segment SE3, a fourth segment SE4 and a fifth segment SE5 from top to bottom. In addition, the first column includes a first segment line SL1, a second segment line SL2, a third segment line SL3, a fourth segment line SL4 and a fifth segment line SL5 from left to right.

In this case, the first segment line SL1 is connected to the auxiliary line AL disposed at the first segment SE1, only. The second segment line SL2 is only connected to the auxiliary line AL disposed at the second segment SE2. Likewise, the third segment line SL3 is only connected to the auxiliary line AL disposed at the third segment SE3. The fourth segment line SL4 is only connected to the auxiliary line AL disposed at the fourth segment SE4. The fifth segment line SL5 is only connected to the auxiliary line AL disposed at the fifth segment SE5. This connection configuration is applied to other segments SE arrayed in other columns.

As shown in FIG. 4, all segment lines SL have the same length so that the line resistances of the segment lines SL have the same value. Therefore, the voltage dropdown on each segment line SL are same. As the results, all segments SE radiate the light with the same brightness and have the same light efficiency.

In addition, as all segment lines SL are arrayed as crossing the substrate from the upper side to the lower side with the same length, when any one segment line SL has any defection so that the segment line SL cannot supply the electric power, the segment SE can be repaired by repairing the connection using other segment line SL having no problem.

The array of the rightmost side column is identical to that of the leftmost side column. In addition, the structures of the auxiliary line AL, the anode layer ANO, the emission element ED, the cathode layer CAT, the first pad AP, the second pad CP and the segment switch S are same as explained in the first aspect, so detailed explain will not be duplicated.

Hereinafter, referring to FIGS. 5A and 5B, an applicable example for the electroluminescence lighting device according to the aspects of the present disclosure will be explained. The electroluminescence lighting device according to the present disclosure has a plurality of segments in the emission area. All segments can be turned on at the same time or some segments are selectively turned on. In the interim, varying the turn-on timing of each segment, the lighting device can provide variously different lighting effects.

Figure 5A:
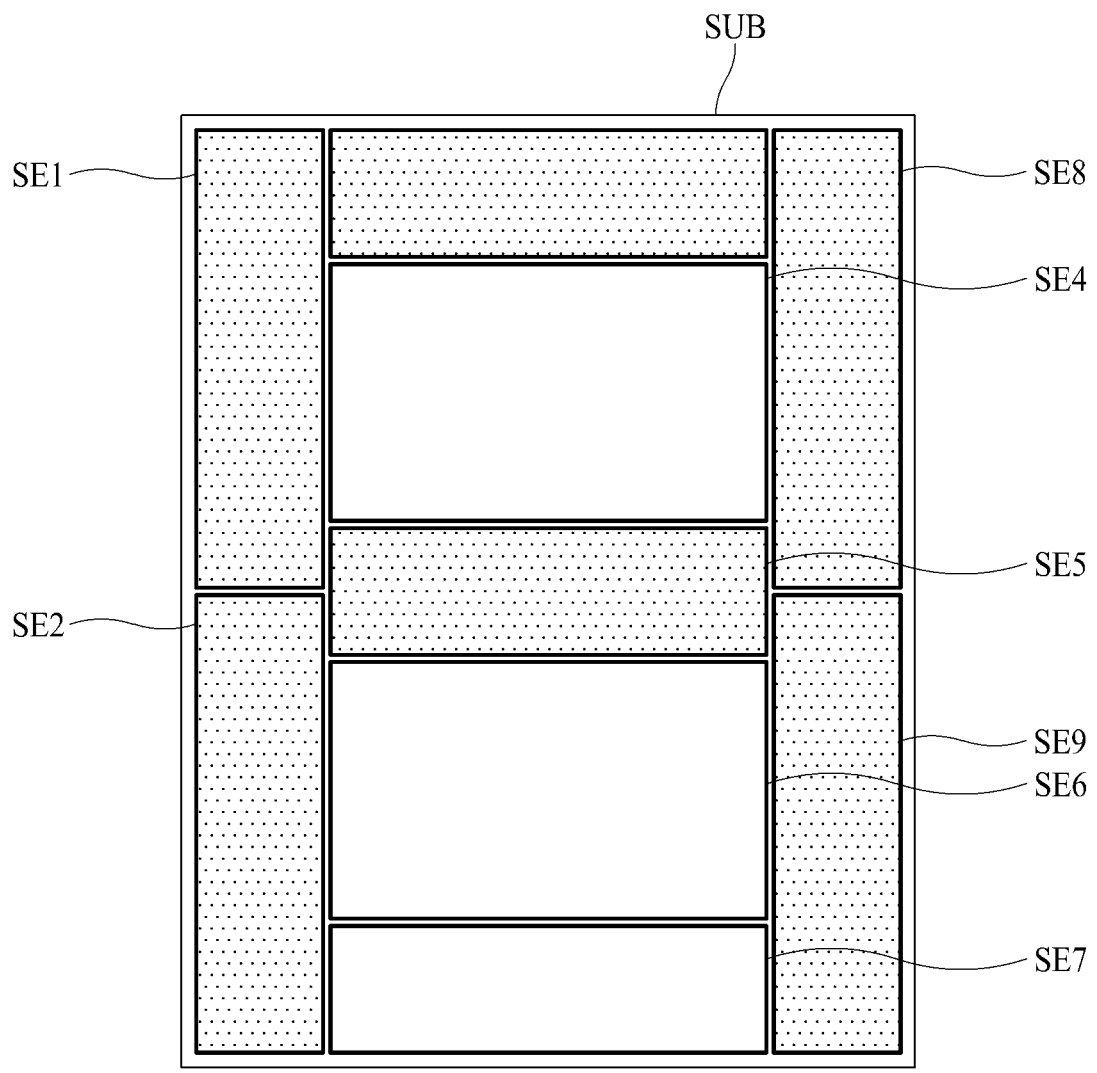
FIG. 5A is a diagram illustrating a partial emission case of the electroluminescence lighting device according to an aspect of the present disclosure.
Figure 5B:
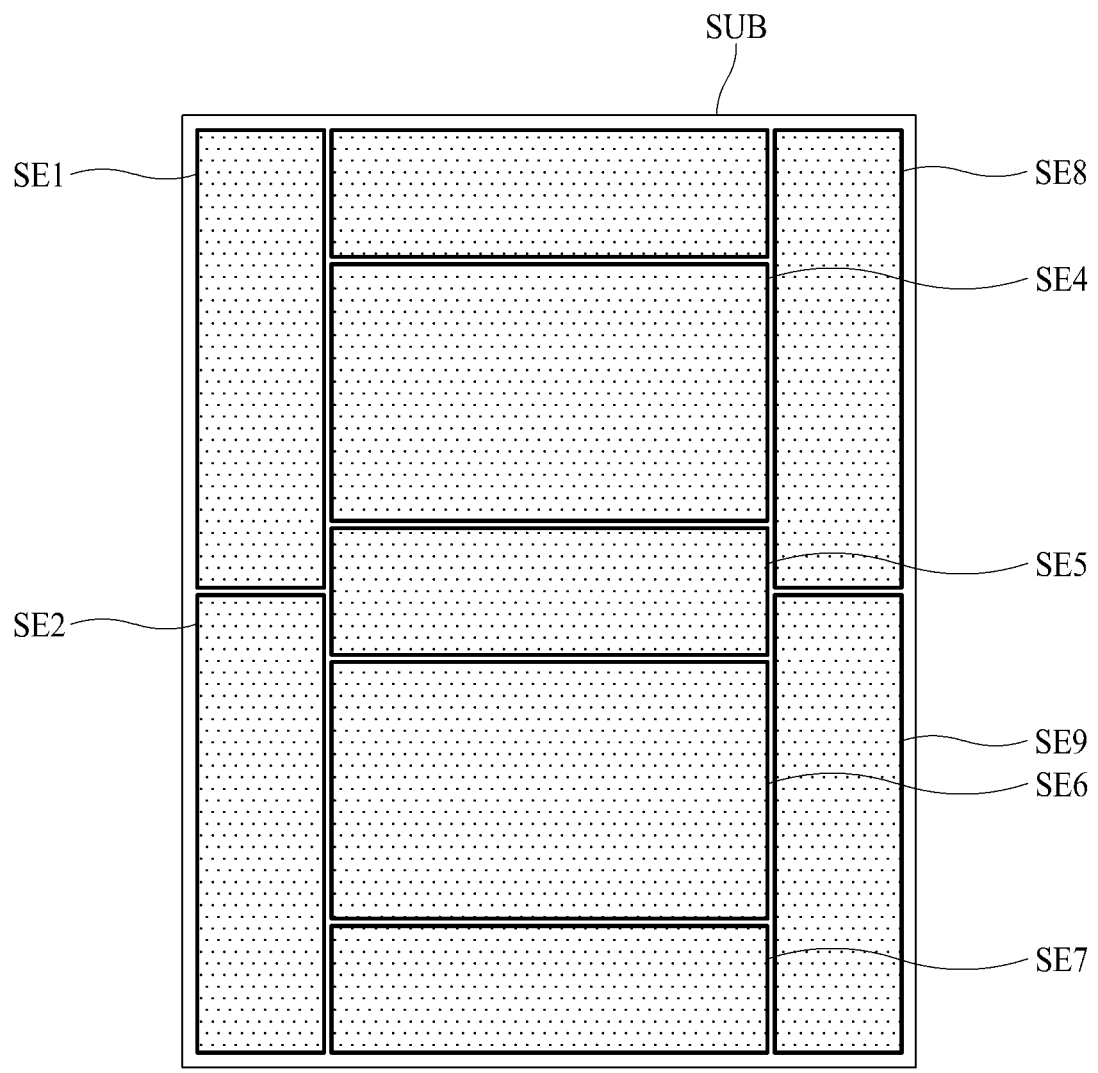
FIG. 5B is a diagram illustrating a total emission case of the electroluminescence lighting device according to another aspect of the present disclosure.

FIG. 5A illustrates the partial emission case in the electroluminescence lighting device according to one aspect of the present disclosure. Referring to FIG. 5A, the first segment switch S1, the second segment switch S2, the third segment switch S3, the fifth segment switch S5, the eighth segment switch S8 and the ninth segment switch S9 are 'ON' state. The fourth segment switch S4, the sixth segment switch S6 and the seventh segment switch S7 are 'OFF' state. Therefore, only the first segment SE1, the second segment SE2, the third segment SE3, the fifth segment SE5, the eighth segment SE8 and the ninth segment SE9 are turned on (or, radiate the lights). In this case, the lighting device can represent alphabet 'A' character. Likewise, the electroluminescence lighting devices according to the present disclosure have the function for radiating lights as well as for providing symbols or characters.

FIG. 5A is a diagram illustration a total emission case of the electroluminescence lighting device according to one example of the present disclosure. Referring to FIG. 5B, all segments S1 to S9 are 'ON' state. In that case, the lighting device is in the total emission state in which all segments S1 to S9 radiate the lights at the same time.

In addition, programming the emission state which can be periodically changed among the partial emission state, the total emission state and the total off-state, the lighting device can be implemented in the variety lighting condition varying over time.

The electroluminescence lighting device according to the aspects of the present disclosure includes a plurality of segmented emission areas divided into a plurality of sectors. Each of segmented emission area includes the auxiliary line defining a plurality of pixels by the mesh structure. In the non-emission area, the first pad for receiving the electric power is disposed. Each segment line connecting the first pad to the auxiliary line disposed in each segment is disposed as be overlapped with the auxiliary line having the buffer layer there-between. The segment switch is allocated between the segment line and the first pad so that the auxiliary line can be selectively connected or disconnected to the first pad.

Using the segment switch, a specific segment can be selectively 'ON' state or 'OFF' state. With various combinations of the 'ON' and 'OFF' states, variety lighting condition can be implemented. In addition, as the segment lines for supplying the electric power to the segment are overlapped with the auxiliary line, so the segment line can be hidden behind the segment so that the area for the segment line can be eliminated. As the results, regardless of the number of the segments, it is possible to maximize the ratio of the segments of the emission area to the whole area of the lighting device.

The electroluminescence lighting device according to the present disclosure includes a plurality of segments dividing the emission area, and a non-emission area surrounding the emission area. In addition, as the segment lines allocated to each segment are overlapped with the segment, it is not required to prepare any additional non-emission portion for disposing the segment lines around the emission area. Therefore, there is no non-emission part between the segments so that, the segments which are 'ON' state and neighboring are not distinguished as being separated, but it looks like one body. As the results, at any time for operating the lighting device, at the total emission case and at the partial emission case, the segments looks like as one body so that various lighting pattern can be provided with superior esthetics and high image quality.

The electroluminescence lighting device according to the present disclosure provides a new structure in which the emission area is divided into a plurality of segments and each segment can be individually operated, so that variety lighting patterns or conditions can be provided. In addition, hiding/overlapping the segment lines for supplying the electric power to each segment under the auxiliary lines, the area for allocating the segment lines can be eliminated. As the results, the electroluminescence lighting device according to the present disclosure has a structure in which any dead zone, non-emission portion, between the segments is not presented even though the emission area is divided into a plurality of segments. Therefore, the present disclosure can provide an electroluminescence lighting device representing various characters, symbols and icons with high visual quality and superior esthetics.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. An electroluminescence lighting device comprising:
   a substrate including an emission area divided into a plurality of segments and a non-emission area surrounding the emission area;
   a segment line extending from the non-emission area to the plurality of segments;
   a buffer layer disposed on the segment line;
   an auxiliary line defining a plurality of pixels within each segment on the buffer layer;
   a first pad disposed at the non-emission area;
   a segment switch disposed at the non-emission area and connecting the first pad to the segment line; and
   an emission element disposed at each pixel,
   wherein the segment line overlaps with the auxiliary line and is connected to the auxiliary line through a contact hole at the buffer layer.

2. The device according to claim 1, further comprising:
   an anode layer disposed on the auxiliary line;
   an emission layer disposed on the anode layer;
   a cathode layer disposed on the emission layer;
   an encapsulation layer disposed on the cathode layer; and
   a cover film attached on the encapsulation layer by an adhesive material.

3. The device according to claim 2, wherein the anode layer comprises:
   a power line contacting and covering the auxiliary line;
   a first electrode disposed in the pixel and coupling to the power line; and
   a link electrode coupling to the first electrode and the power line.

4. The device according to claim 3, further comprising a passivation layer covering the power line, the link electrode and circumferences of the first electrode, and exposing middle portions of the first electrode to define an open area.

5. The device according to claim 4, wherein the emission element includes the first electrode, the emission layer and the cathode layer sequentially formed at the open area.

6. The device according to claim 2, further comprising a second electrode extended from the cathode layer to the non-emission area.

7. The device according to claim 1, wherein the plurality of segments have a same size and is disposed in a matrix form.

8. The device according to claim 1, wherein the segment line is formed to correspond to the same number of the plurality of segments disposed in a column direction and overlaps the plurality of segments.

9. The device according to claim 1, wherein the auxiliary line allocated in each segment is connected to each segment line in one-to-one correspondence through one contact hole allocated for each segment.

10. The device according to claim 1, wherein the first pad supplies an electric voltage for driving the plurality of segments to the segment line.

11. An electroluminescence lighting device comprising:
an emission area and a non-emission area defined in a substrate, wherein the emission is divided into a plurality of segments that includes a plurality of pixels and the non-emission area disposed outside the emission area;
a plurality of segment lines extending from the non-emission area electrically connected to the plurality of segments;
first and second pads defined in the non-emission area;
a plurality of segment switches disposed in the non-emission area and connecting the first pad to the plurality of segment lines;
an emission element disposed in each pixel; and
a cathode layer of the emission element covering the plurality of segments.

12. The device according to claim 11, further comprising an auxiliary line defining a plurality of pixels within each segment.

13. The device according to claim 11, further comprising a buffer layer disposed on the substrate and preventing foreign materials from intruding into the emission element.

14. The device according to claim 11, wherein the first pad receives a driving power from outside and selectively supplies the driving power to the plurality of segments.

15. The device according to claim 11, wherein the segment switch is disposed between the first pad and the plurality of segments.

16. The device according to claim 11, wherein the second pad is disposed in the non-emission area and electrically disconnected from the first pad.

17. The device according to claim 11, wherein the second pad is disposed at both sides of the first pad.

18. The device according to claim 11, wherein the second pad receives a common voltage for driving the plurality of segments.

19. The device according to claim 11, wherein the second pad CP is connected to the cathode layer CAT or formed as s single body with the cathode layer.

* * * * *